United States Patent
Kaviani et al.

(10) Patent No.: US 7,057,460 B2
(45) Date of Patent: Jun. 6, 2006

(54) DIFFERENTIAL AMPLIFIER WITH ADAPTIVE BIASING AND OFFSET CANCELLATION

(75) Inventors: Kambiz Kaviani, Palo Alto, CA (US); Kun-Yung Chang, Los Altos, CA (US); Abhijit Abhyankar, Sunnyvale, CA (US)

(73) Assignee: Rambus, Inc., Los Altos, CA (US)

( * ) Notice: Subject to any disclaimer, the term of this patent is extended or adjusted under 35 U.S.C. 154(b) by 23 days.

(21) Appl. No.: 10/878,441

(22) Filed: Jun. 29, 2004

(65) Prior Publication Data

US 2005/0285678 A1  Dec. 29, 2005

(51) Int. Cl.
*H03F 3/45* (2006.01)

(52) U.S. Cl. .......................... 330/261; 330/9; 330/257; 330/258

(58) Field of Classification Search .................... 330/9, 330/257, 258, 261
See application file for complete search history.

(56) References Cited

U.S. PATENT DOCUMENTS

| | | | | |
|---|---|---|---|---|
| 5,434,544 A | * | 7/1995 | Van Veenendaal | 331/117 R |
| 5,912,583 A | * | 6/1999 | Pierson et al. | 327/553 |
| 6,369,652 B1 | * | 4/2002 | Nguyen et al. | 330/253 |
| 6,388,494 B1 | * | 5/2002 | Kindt et al. | 327/307 |
| 6,753,732 B1 | * | 6/2004 | Moreland | 330/261 |

* cited by examiner

*Primary Examiner*—Patricia Nguyen
(74) *Attorney, Agent, or Firm*—Hunton & Williams LLP (57) ABSTRACT

A differential amplifier with adaptive biasing and offset cancellation is disclosed. In one particular exemplary embodiment, the differential amplifier may comprise a first electrical path comprising a first transistor and a first resistance element, and a second electrical path comprising a second transistor and a second resistance element, where the first and the second electrical paths are coupled to a voltage source on one end and to a current source on the other end. The differential amplifier may further comprise a first adjustable current source coupled between the voltage source and a first node located between the first transistor and the first resistance element, and a second adjustable current source coupled between the voltage source and a second node located between the second transistor and the second resistance element, wherein the first and second adjustable current sources provide biasing currents for the two electrical paths.

19 Claims, 6 Drawing Sheets

DIFFERENTIAL AMPLIFIER WITH ADAPTIVE BIASING AND OFFSET CANCELLATION

FIELD OF THE DISCLOSURE

The present disclosure relates generally to electronic circuits and, more particularly, to a differential amplifier with adaptive biasing and offset cancellation.

BACKGROUND OF THE DISCLOSURE

Differential amplifiers are well-known electronic devices for amplifying a voltage difference between two input signals. A differential amplifier usually comprises two electrical paths ("legs") that are independently coupled to a voltage source at one end, and are together coupled to a voltage or current source at an opposite end. Each electrical path usually comprises a transistor element and a resistance element. Two input signals can be applied to the transistor elements, and an output signal can be extracted from each electrical path between its transistor element and resistance element. The two electrical paths are usually designed to substantially match each other, such that components common to both input signals are cancelled out and a voltage difference between the input signals is amplified.

Figure 1:
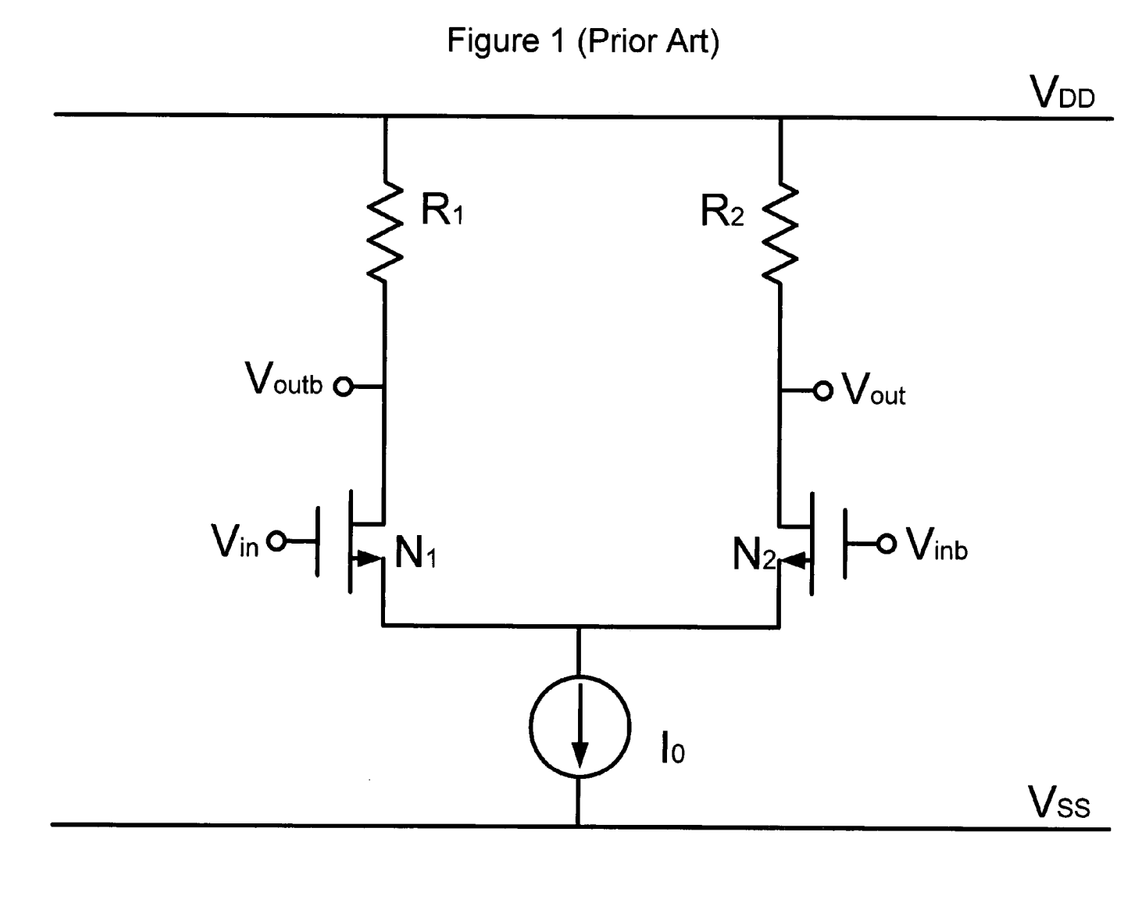
FIG. 1 is a circuit schematic illustrating a prior art differential amplifier.
Figure 2:
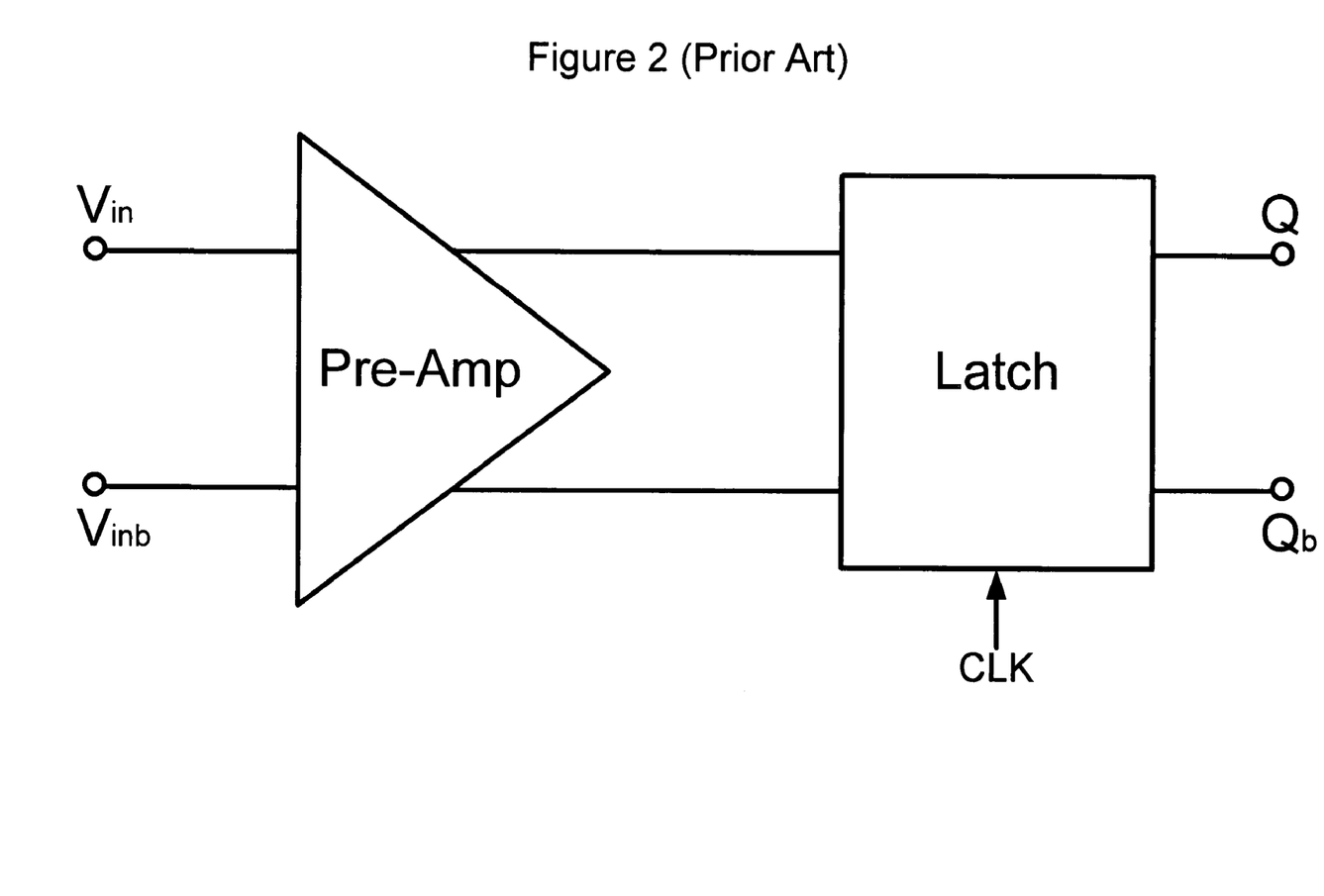
FIG. 2 is a block diagram illustrating a prior art input receiver.

FIG. 1 illustrates a prior art differential amplifier based on N-type metal-oxide-semiconductor (MOS) transistors. As shown, MOS transistor $N_1$ and resistor $R_1$ form a first electrical path while MOS transistor $N_2$ and resistor $R_2$ form a second electrical path. The two electrical paths are independently coupled to a voltage supply $V_{DD}$ at one end and are together coupled to a common current source $I_0$ at an opposite end. Input signals $V_{in}$ and $V_{inb}$ are applied to the gates of the MOS transistors, and differential outputs $V_{out}$ and $V_{outb}$ are extracted from between the transistors and the resistors. This type of differential amplifier is often used in pre-amplification stages of high frequency sampling and detection circuits such as a pre-amplifier in input receivers of high-speed links or memory interfaces. Differential amplification in an input receiver can reduce the effect of offset and kickback of subsequent input sampling circuits. It can also reject common-mode input noise for the subsequent sampling circuits, improving the accuracy and speed of sampling operations. An input receiver may contain one or more stages of differential amplification followed by a regenerative latch. One simple example is shown in FIG. 2, wherein a differential amplifier-based pre-amplifier (Pre-Amp) samples input signals $V_{in}$ and $V_{inb}$, and outputs signals to a latch (Latch) where they are sampled via a clock signal (CLK) and stored, and provided as complimentary output signals (Q, $Q_b$).

Figure 3:
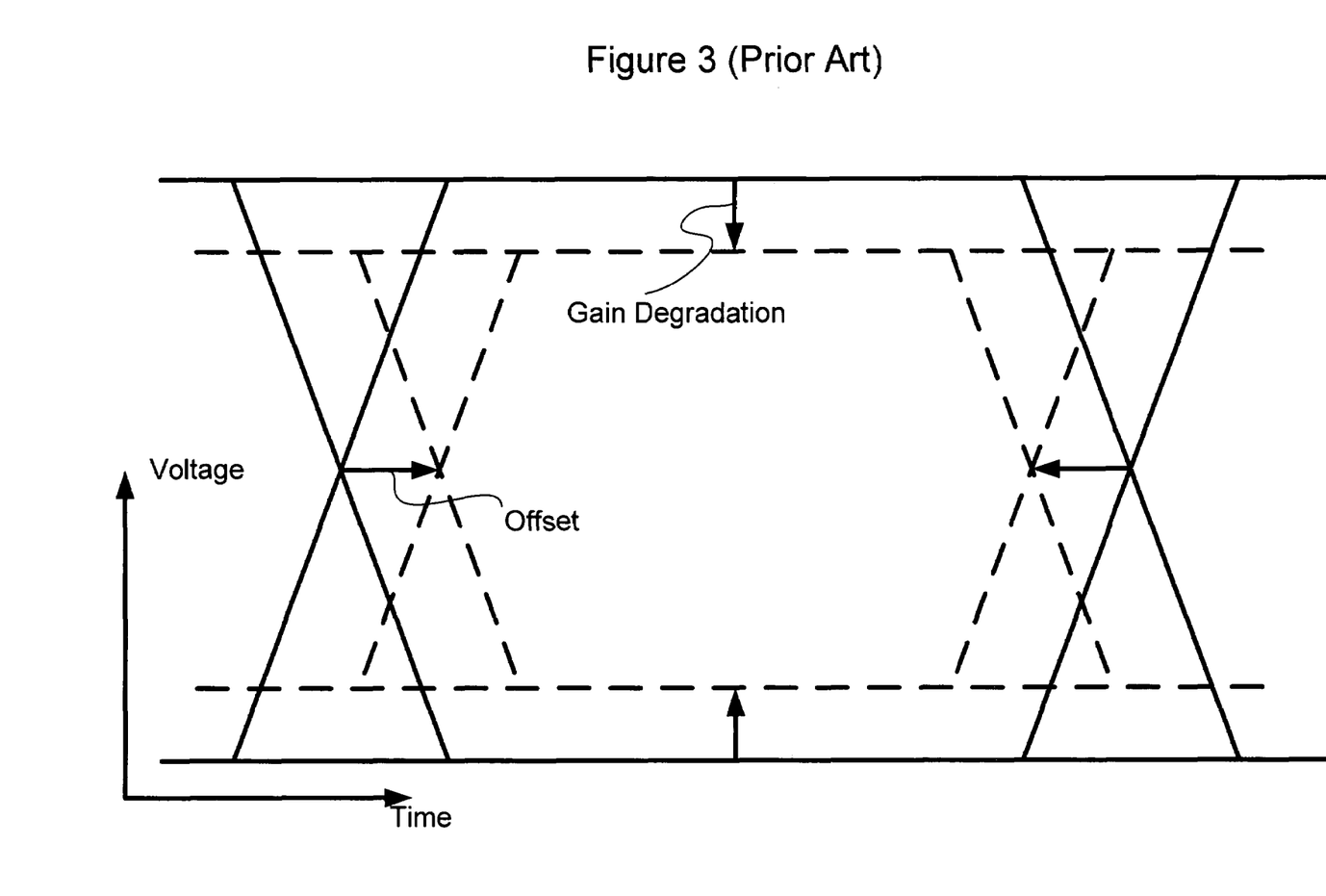
FIG. 3 is an illustrated example of degraded performance of a prior art differential amplifier.

A number of problems may affect the performance of a differential amplifier. For example, a differential amplifier's major characteristics, such as gain and output swings, usually vary with process, temperature and voltage conditions. Moreover, device mismatches in a differential pair can degrade the amplifier sensitivity to low-swing input signals, thus reducing the effective sampling time aperture of an input receiver. An example of reduced sampling time aperture due to gain degradation and offset is shown in FIG. 3. Especially in a differential amplifier for high-data-rate and low-voltage applications (e.g., high-speed memory devices), the effect of process, temperature and voltage variations, as well as input offset, can be highly detrimental. To battle the input offset, some prior art designs resort to capacitor trimming and auto zero cancellation techniques, both of which tend to result in decreased operating speed in addition to increased area and cost.

In view of the foregoing, it would be desirable to provide an improved differential amplifier which overcomes the above-described inadequacies and shortcomings.

SUMMARY OF THE DISCLOSURE

A differential amplifier with adaptive biasing and offset cancellation is disclosed. In one particular exemplary embodiment, the differential amplifier may comprise a first electrical path comprising a first transistor and a first resistance element, where the first transistor is coupled to a current source and the first resistance element is coupled to a voltage source. The differential amplifier may also comprise a second electrical path comprising a second transistor and a second resistance element, where the second transistor is coupled to the current source and the second resistance element is coupled to the voltage source. The differential amplifier may further comprise a first adjustable current source, coupled between the voltage source and a first node located between the first transistor and the first resistance element, that provides a first biasing current for the first electrical path. The differential amplifier may additionally comprise a second adjustable current source, coupled between the voltage source and a second node located between the second transistor and the second resistance element, that provides a second biasing current for the second electrical path.

In accordance with other aspects of this particular exemplary embodiment, the first electrical path and the second electrical path may be substantially matched.

In accordance with further aspects of this particular exemplary embodiment, the first electrical path may further comprise a third transistor electrically coupled between the first node and the first resistance element, the second electrical path may further comprise a fourth transistor electrically coupled between the second node and the second resistance element, and the third transistor and the fourth transistor may share a common gate bias.

In accordance with additional aspects of this particular exemplary embodiment, at least one of the first adjustable current source and the second adjustable current source may be adjusted in response to process, voltage or temperature conditions.

In accordance with another aspect of this particular exemplary embodiment, at least one of the first current source and the second current source may be provided by at least one biasing circuit. The at least one biasing circuit may comprise a third electrical path coupled between the voltage source and a replica current source, wherein the third electrical path comprises at least one fifth transistor and a third resistance element where the at least one fifth transistor is coupled to the current source and the third resistance element is coupled to the voltage source. The at least one biasing circuit may also comprise a current digital-to-analog converter that provides a third biasing current for the third electrical path. The current digital-to-analog converter may be adjusted in response to process, voltage or temperature conditions. The at least one biasing circuit may further comprise a feedback loop that maintains a constant-swing bias across a resistive load in the third electrical path, and the feedback loop may comprise an operational amplifier.

In accordance with yet another aspect of this particular exemplary embodiment, at least one of the first biasing current and the second biasing current may be provided by a current mirror.

In accordance with still another aspect of this particular exemplary embodiment, a difference between the first biasing current and the second biasing current may be adjusted based on a digital-to-analog converter. A sum of the first biasing current and the second biasing current may be adjusted based on a replica biasing circuit associated with the differential amplifier.

In accordance with a further aspect of this particular exemplary embodiment, at least one of the first transistor and the second transistor may be a field effect transistor.

In accordance with a still further aspect of this particular exemplary embodiment, the differential amplifier as recited above may be implemented as part of an input receiver in a memory unit.

In another particular exemplary embodiment, a method for amplifying signals may comprise the step of providing a first signal to a first input of a differential amplifier comprising two substantially matched electrical paths coupled between a voltage source and a current source. The method may also comprise the step of providing a second signal to a second input of the differential amplifier. The method may further comprise the step of compensating for current flows caused by the first signal and the second signal by providing biasing currents for the two electrical paths based on two adjustable current sources.

In accordance with other aspects of this particular exemplary embodiment, the method may further comprise providing the two adjustable current sources based on at least one replica biasing circuit associated with the differential amplifier.

In accordance with further aspects of this particular exemplary embodiment, the method may further comprise adaptively calibrating the at least one replica biasing circuit to provide the biasing currents.

In accordance with additional aspects of this particular exemplary embodiment, the method may further comprise adjusting a difference between the biasing currents to compensate for an offset between the first signal and the second signal.

In accordance with another aspect of this particular exemplary embodiment, the method may further comprise adjusting a difference between the biasing currents to reduce offset in one or more subsequent stages of signal processing.

In accordance with yet another aspect of this particular exemplary embodiment, the method may further comprise adjusting a sum of the biasing currents and a difference between the biasing currents.

In yet another particular exemplary embodiment, an apparatus for amplifying signals may comprise means for providing a first signal to a first input of a differential amplifier comprising two substantially matched electrical paths coupled between a voltage source and a current source. The apparatus may also comprise means for providing a second signal to a second input of the differential amplifier. The apparatus may further comprise means for compensating for current flows caused by the first signal and the second signal by providing biasing currents for the two electrical paths based on two adjustable current sources.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENT(S)

Figure 4:
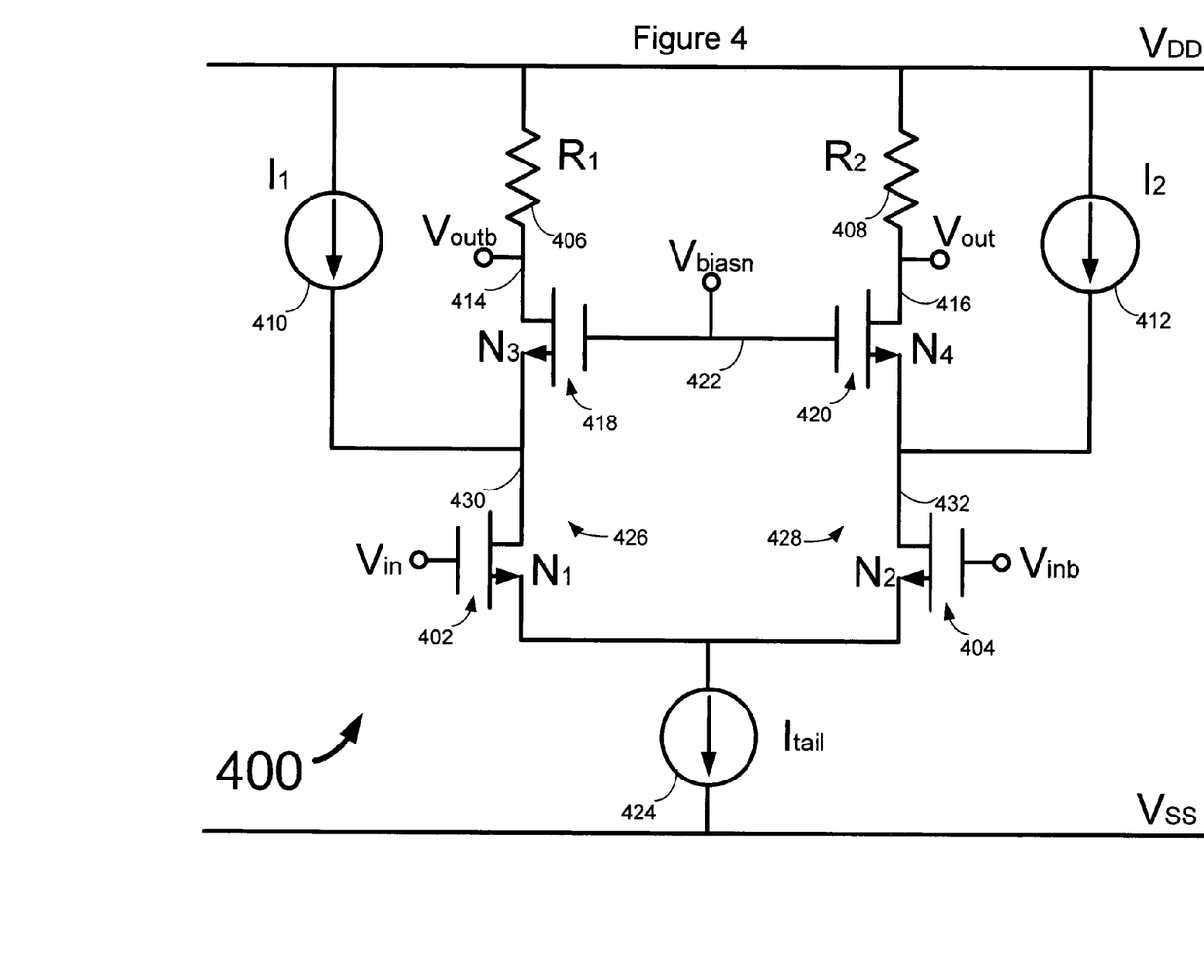
FIG. 4 is a circuit schematic illustrating an exemplary differential amplifier in accordance with an embodiment of the present disclosure.

Referring to FIG. 4, there is shown a circuit schematic illustrating an exemplary differential amplifier 400 in accordance with an embodiment of the present disclosure. The differential amplifier 400 may comprise two electrical paths 426 and 428. These two electrical paths may be coupled to a voltage source $V_{DD}$ at one end and, at an opposite end, to a current source 424 which supplies a tail current $I_{tail}$. The electrical path 426 may comprise at least one transistor and one resistance element. The transistor may be a bipolar junction transistor (BJT) or a field effect transistor (FET). The resistance element may be a passive load such as a resistor or an active load such as a transistor. As shown in FIG. 4, the electrical path 426 comprises an N-type MOS transistor ($N_1$) 402, a resistor ($R_1$) 406, and an optional N-type MOS transistor ($N_3$) 418 between the transistor 402 and the resistor 406. The optional transistor 418 may be so positioned to isolate an output node 414 from input parasitics for high-speed operations. The electrical path 428 may be designed to substantially match the electrical path 426. As shown, the electrical path 428 comprises an N-type MOS transistor ($N_2$) 404, a resistor ($R_2$) 408, and an optional N-type MOS transistor ($N_4$) 420 between the transistor 404 and the resistor 408. The gates of the transistor 418 and the transistor 420 may be coupled to a common node 422. Therefore, both gates may be biased at a common voltage $V_{biasn}$. Two input signals, $V_{in}$ and $V_{inb}$, may be fed to the gates of the transistors 402 and 404, respectively. Two output signals, $V_{out}$ and $V_{outb}$, may be extracted from the node 416 and the node 414, respectively.

For enhanced performance in the presence of potential input referred offset and process-temperature-voltage variations, an adaptive biasing technique may be adopted. Accordingly, two current sources 410 and 412 may be incorporated to provide supplemental biasing currents, $I_1$ and $I_2$, for the two electrical paths, 426 and 428. That is, the current source 410 may be coupled between the voltage source $V_{DD}$ and a node 430, providing supplemental biasing current $I_1$ to the electrical path 426 that may or may not change the common-mode voltage at output node 414. The current source 412 may be coupled between the voltage source $V_{DD}$ and a node 432, providing supplemental biasing current $I_2$ to the electrical path 428 that may or may not change the common-mode voltage at output node 416. Both current sources 410 and 412 may be adaptively adjusted or calibrated to achieve a desired performance (e.g., gain, offset, and/or power dissipation) for the differential amplifier 400. For example, when, due to process variations, the tail current $I_{tail}$ exceeds a desired current budget, the current sources 410 and 412 may be tuned down or even turned off to reduce power dissipation. If the differential amplifier 400 is suffering from a gain reduction due to slow devices, the current sources 410 and 412 may be adjusted to provide additional biasing currents, thus increasing transconductance of the input transistor pair (402 and 404). As a result, the overall gain of the differential amplifier 400 may be restored or increased.

Figure 5:
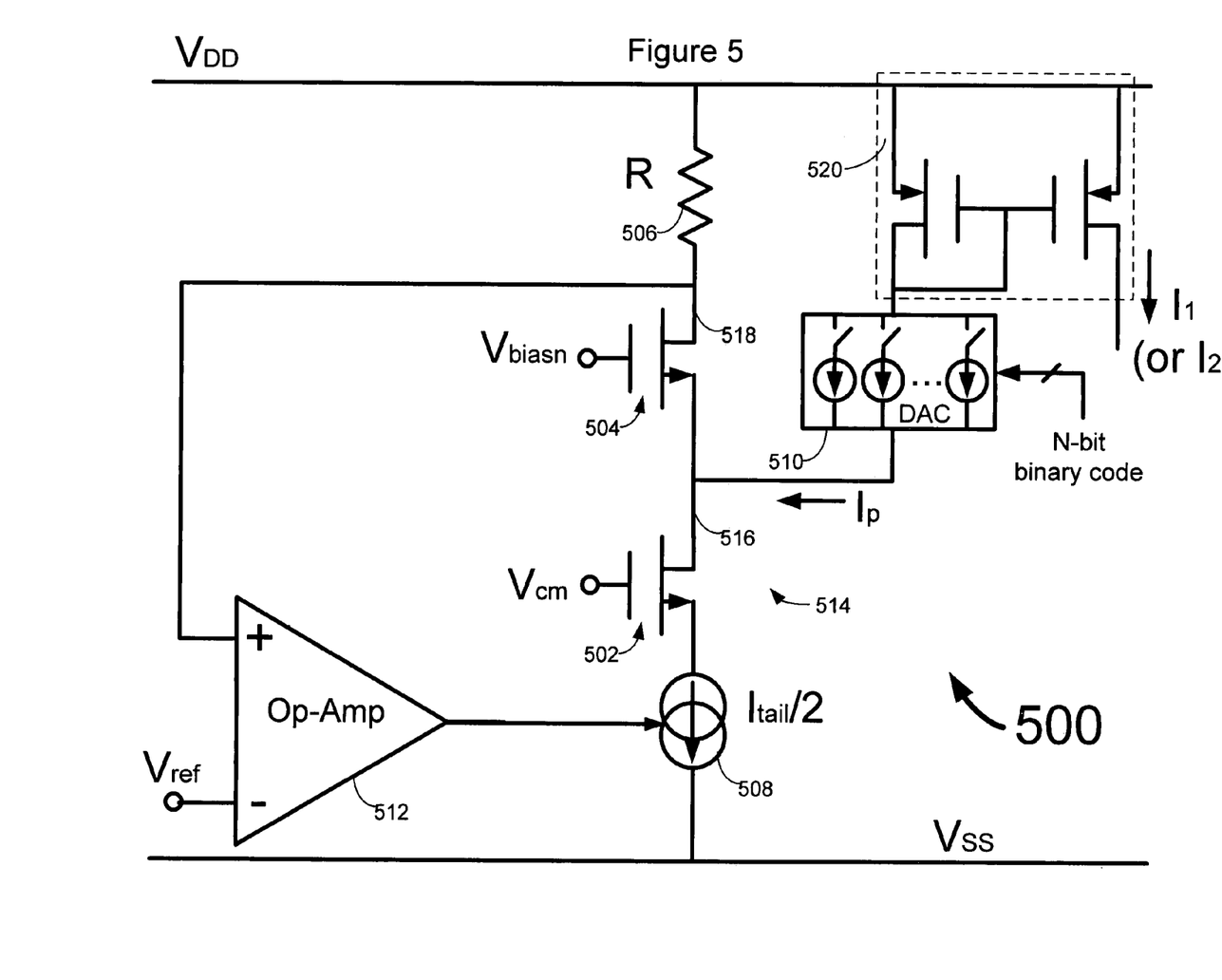
FIG. 5 is a circuit schematic illustrating an exemplary adaptive biasing circuit in accordance with an embodiment of the present disclosure.

The adaptive biasing technique introduced above may be achieved with various circuit designs. FIG. 5 is a circuit schematic illustrating one exemplary adaptive biasing circuit 500 in accordance with an embodiment of the present disclosure. This exemplary adaptive biasing circuit 500 may comprise an electrical path 514 that replicates one half of the main differential amplifier circuit depicted in FIG. 4. That is, transistor 502 may be designed to substantially match transistors 402 and 404, transistor 504 may substantially match transistors 418 and 420, resistor 506 may substantially match resistors 406 and 408 (e.g., $R=R_1=R_2$), and a voltage-controlled current source 508 may provide one half the tail current $I_{tail}$. This replica electrical path may be coupled to the same power supply rails ($V_{DD}$ and $V_{SS}$) as the circuit 400 in FIG. 4. In addition, the gate of transistor 502 may be biased by a voltage $V_{cm}$ that reflects the common-mode voltage of the differential inputs $V_{in}$ and $V_{inb}$, and the gate bias of transistor 504 may be held at $V_{biasn}$.

A current digital-to-analog converter (DAC) 510 may be coupled between the voltage source $V_{DD}$ and a node 516 between transistors 502 and 504. The position of the current DAC 510 may be similar to that of the current sources 410 and 412 relative to their respective electrical paths. An N-bit binary code indicative of process, voltage and/or temperature conditions of the amplifier 400 and its adjacent circuitry may be used to control an output current $I_p$ from the current DAC 510. A current mirror 520 may be used to derive the supplemental biasing currents $I_1$ or $I_2$ based on the DAC output current $I_p$. Calibration of the output current $I_p$ may be performed upon initialization of the differential amplifier 400 or on a periodic basis. According to one embodiment of the present disclosure, a 4-bit code representing 16 levels of digital input may be used in calibrating the DAC output current $I_p$. According to other embodiments of the present disclosure, a single biasing circuit as depicted in FIG. 5 may provide a same or similar amount of current to both the current sources 410 and 412. Alternatively, different amounts of supplemental biasing current may be provided based on one or more biasing circuits.

To maintain a constant swing bias across load resistor 506, a feedback loop with an operational amplifier (Op-Amp) 512 may be provided between node 518 and the voltage-controlled current source 508. A reference voltage $V_{ref}$ for the op-amp 512 may be generated by a reference generator such as a bandgap reference circuit (not shown). Alternatively, the reference voltage $V_{ref}$ as well as $V_{biasn}$ and $V_{cm}$, may be generated by one or more resistor divider circuits (not shown). The Op-Amp (512) output may control the tail current of the differential amplifier 400 via the voltage-controlled current source 508, such that a constant output swing may be maintain at the output nodes 414 and 416 across potential process-temperature-voltage variations.

Figure 6:
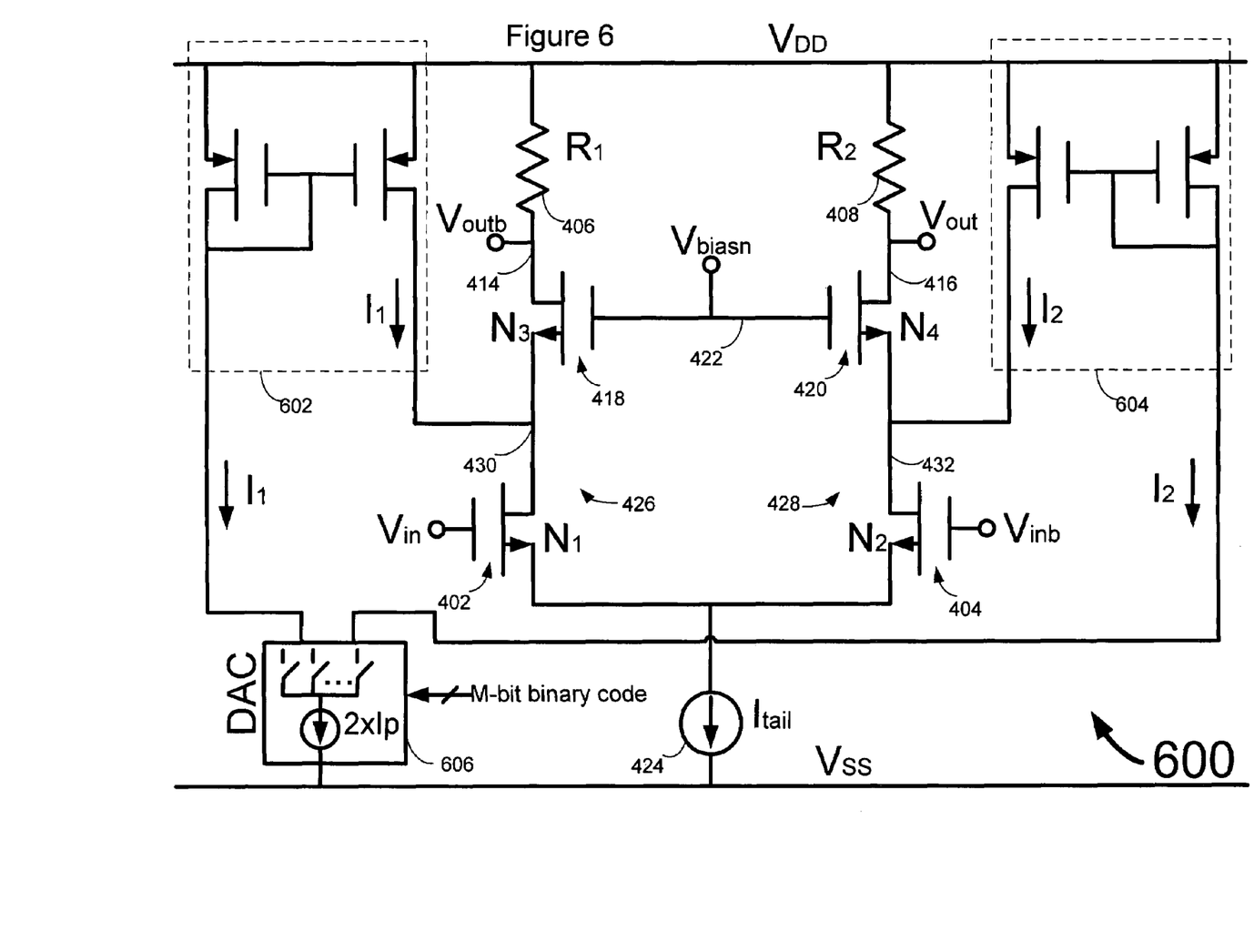
FIG. 6 is a circuit schematic illustrating another exemplary differential amplifier in accordance with an embodiment of the present disclosure.

FIG. 6 is a circuit schematic illustrating another exemplary differential amplifier 600 in accordance with an embodiment of the present disclosure. The differential amplifier 600 may be one variation based on the differential amplifier 400, where the current sources 410 and 412 are replaced by current mirrors 602 and 604. Further, a difference between the supplemental biasing currents $I_1$ and $I_2$ may be utilized in compensating for the aforementioned input offset. For offset compensation, the current difference between $I_1$ and $I_2$ may be adaptively adjusted or calibrated with a difference DAC 606. Due to the cascading of the transistors 418 and 420, the offset compensation may be accomplished without any degradation in sampling speed. To maintain a desired performance, the difference DAC 606 may be periodically calibrated with an M-bit binary code. The total supplemental biasing current $2 \times I_p = (I_1 + I_2)$ flowing out of the difference DAC 606 may be determined based on a biasing circuit similar to the one shown in FIG. 5.

According to one embodiment, the total supplemental biasing current $2 \times I_p$ may be first calibrated to optimize the performance of the amplifier 600 in terms of gain and power dissipation. Then, the difference between the supplemental biasing currents $I_1$ and $I_2$ may be calibrated to cancel the input offset. According to another embodiment, for real-time operation, a replica of the differential amplifier 600 may be pre-calibrated and routed in place of the differential amplifier 600 through a multiplexer. According to another embodiment, the necessary binary code for calibrating the difference DAC 606 in the differential amplifier replica may be routed to the differential amplifier 600 through a multiplexer, for example. Furthermore, multiple stages of differential pairs may be included in input receiver pre-amplification to accommodate level-shifting and/or to optimize gain-bandwidth product. In such designs, the offset compensation technique described above may be applied to all stages including any subsequent regenerative latch circuit.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the following appended claims. Further, although the present disclosure has been described herein in the context of a particular implementation in a particular environment for a particular purpose, those of ordinary skill in the art will recognize that its usefulness is not limited thereto and that the present disclosure can be beneficially implemented in any number of environments for any number of purposes. Accordingly, the claims set forth below should be construed in view of the full breadth and spirit of the present disclosure as described herein.

The invention claimed is:

1. A differential amplifier comprising:
   a first electrical path comprising a first transistor and a first resistance element, where the first transistor is coupled to a current source and the first resistance element is coupled to a voltage source;
   a second electrical path comprising a second transistor and a second resistance element, where the second transistor is coupled to the current source and the second resistance element is coupled to the voltage source;
   a first adjustable current source, coupled between the voltage source and a first node located between the first transistor and the first resistance element, that provides a first biasing current for the first electrical path; and
   a second adjustable current source, coupled between the voltage source and a second node located between the second transistor and the second resistance element, that provides a second biasing current for the second electrical path,
   wherein:
      the first electrical path further comprises a third transistor electrically coupled between the first node and the first resistance element,
      the second electrical path further comprises a fourth transistor electrically coupled between the second node and the second resistance element, and
      the third transistor and the fourth transistor share a common gate bias.

2. The differential amplifier according to claim 1, wherein the first electrical path and the second electrical path are substantially matched.

3. The differential amplifier according to claim 1, wherein at least one of the first adjustable current source and the second adjustable current source is adjusted in response to process, voltage or temperature conditions.

4. A differential amplifier comprising:
   a first electrical path comprising a first transistor and a first resistance element, where the first transistor is coupled to a current source and the first resistance element is coupled to a voltage source;
   a second electrical path comprising a second transistor and a second resistance element, where the second transistor is coupled to the current source and the second resistance element is coupled to the voltage source;
   a first adjustable current source, coupled between the voltage source and a first node located between the first transistor and the first resistance element, that provides a first biasing current for the first electrical path; and a second adjustable current source, coupled between the voltage source and a second node located between the second transistor and the second resistance element, that provides a second biasing current for the second electrical path,
   wherein at least one of the first current source and the second current source is provided by at least one biasing circuit, wherein the at least one biasing circuit comprises:
      a third electrical path coupled between the voltage source and a replica current source, wherein the third electrical path comprises at least one fifth transistor and a third resistance element where the at least one fifth transistor is coupled to the current source and the third resistance element is coupled to the voltage source; and
      a current digital-to-analog converter that provides a third biasing current for the third electrical path.

5. The differential amplifier according to claim 4, wherein the current digital-to-analog converter is adjusted in response to process, voltage or temperature conditions.

6. The differential amplifier according to claim 4, wherein the at least one biasing circuit further comprises a feedback loop that maintains a constant-swing bias across a resistive load in the third electrical path.

7. The differential amplifier according to claim 6, wherein the feedback loop comprises an operational amplifier.

8. The differential amplifier according to claim 1, wherein at least one of the first biasing current and the second biasing current is provided by a current mirror.

9. The differential amplifier according to claim 1, wherein a difference between the first biasing current and the second biasing current is adjusted based on a digital-to-analog converter.

10. The differential amplifier according to claim 9, wherein a sum of the first biasing current and the second biasing current is adjusted based on a replica biasing circuit associated with the differential amplifier.

11. The differential amplifier according to claim 1, wherein at least one of the first transistor and the second transistor is a field effect transistor.

12. The differential amplifier according to claim 1, implemented as part of an input receiver in a memory unit.

13. A method for amplifying signals, the method comprising:
   providing a first signal to a first input of a differential amplifier comprising two substantially matched electrical paths coupled between a voltage source and a current source;
   providing a second signal to a second input of the differential amplifier;

isolating output nodes of the differential amplifier from the first and second inputs with two transistors that share a common gate bias; and compensating for current flows caused by the first signal and the second signal by providing biasing currents for the two electrical paths based on two adjustable current sources.

14. The method according to claim 13 further comprising:

providing the two adjustable current sources based on at least one replica biasing circuit associated with the differential amplifier.

15. The method according to claim 14 further comprising:

adaptively calibrating the at least one replica biasing circuit to provide the biasing currents.

16. The method according to claim 13 further comprising:

adjusting a difference between the biasing currents to compensate for an offset between the first signal and the second signal.

17. The method according to claim 13 further comprising:

adjusting a difference between the biasing currents to reduce offset in one or more subsequent stages of signal processing.

18. The method according to claim 13 further comprising:

adjusting a sum of the biasing currents and a difference between the biasing currents.

19. An apparatus for amplifying signals, the apparatus comprising:

means for providing a first signal to a first input of a differential amplifier comprising two substantially matched electrical paths coupled between a voltage source and a current source;

means for providing a second signal to a second input of the differential amplifier;

means for isolating output nodes of the differential amplifier from the first and second inputs with two transistors that share a common gate bias; and means for compensating for current flows caused by the first signal and the second signal by providing biasing currents for the two electrical paths based on two adjustable current sources.

* * * * *